United States Patent
Reece et al.

(10) Patent No.: US 9,490,185 B2
(45) Date of Patent: Nov. 8, 2016

(54) IMPLANT-INDUCED DAMAGE CONTROL IN ION IMPLANTATION

(71) Applicant: Axcelis Technologies, Inc., Beverly, MA (US)

(72) Inventors: Ronald N. Reece, Westwood, MA (US); Shu Satoh, Byfield, MA (US); Serguei Kondratenko, Swampscott, MA (US); Andy Ray, Newburyport, MA (US)

(73) Assignee: AXCELIS TECHNOLOGIES, INC., Beverly, MA (US)

( * ) Notice: Subject to any disclaimer, the term of this patent is extended or adjusted under 35 U.S.C. 154(b) by 443 days.

(21) Appl. No.: 14/013,728

(22) Filed: Aug. 29, 2013

(65) Prior Publication Data
US 2014/0065730 A1 Mar. 6, 2014

Related U.S. Application Data

(60) Provisional application No. 61/695,836, filed on Aug. 31, 2012.

(51) Int. Cl.
*H01L 21/66* (2006.01)
*C23C 14/48* (2006.01)
*H01J 37/304* (2006.01)
*H01J 37/317* (2006.01)

(52) U.S. Cl.
CPC ............ *H01L 22/26* (2013.01); *C23C 14/48* (2013.01); *H01J 37/304* (2013.01); *H01J 37/3171* (2013.01); *H01J 2237/30455* (2013.01); *H01J 2237/30472* (2013.01); *H01J 2237/31703* (2013.01); *H01L 2924/0002* (2013.01)

(58) Field of Classification Search
CPC ....... H01L 22/26; C23C 14/48; H01J 37/304
USPC ................................................ 438/5; 250/492
See application file for complete search history.

(56) References Cited

U.S. PATENT DOCUMENTS

| | | | |
|---|---|---|---|
| 5,418,378 A | 5/1995 | Friede et al. | |
| 5,811,823 A * | 9/1998 | Blake | H01J 27/14 250/397 |
| 6,501,080 B1 * | 12/2002 | Tomita | H01J 37/3171 250/492.21 |

(Continued)

FOREIGN PATENT DOCUMENTS

JP 61195553 A * 8/1986 ........... H01L 21/265

OTHER PUBLICATIONS

English translation 61195553JPA (1) tran.pdf of JP361195553A.*

*Primary Examiner* — Moazzam Hossain
(74) *Attorney, Agent, or Firm* — Eschweiler & Associates, LLC

(57) ABSTRACT

An ion implantation system is provided having an ion implantation apparatus configured to provide a spot ion beam having a beam density to a workpiece, wherein the workpiece has a crystalline structure associated therewith. A scanning system iteratively scans one or more of the spot ion beam and workpiece with respect to one another along one or more axes. A controller is also provided and configured to establish a predetermined localized temperature of the workpiece as a predetermined location on the workpiece is exposed to the spot ion beam. A predetermined localized disorder of the crystalline structure of the workpiece is thereby achieved at the predetermined location, wherein the controller is configured to control one or more of the beam density of the spot ion beam and a duty cycle associated with the scanning system to establish the localized temperature of the workpiece at the predetermined location on the workpiece.

11 Claims, 5 Drawing Sheets

(56) References Cited

U.S. PATENT DOCUMENTS

| | | | |
|---|---|---|---|
| 7,109,499 B2* | 9/2006 | Angel | G01T 1/29 250/492.2 |
| 7,358,510 B2 | 4/2008 | Olson et al. | |
| 2006/0076510 A1* | 4/2006 | Chang | H01J 37/3171 250/492.21 |
| 2007/0181830 A1* | 8/2007 | Horsky | H01J 27/20 250/492.21 |
| 2007/0221870 A1* | 9/2007 | Olson | H01J 37/3023 250/492.21 |
| 2008/0023654 A1* | 1/2008 | Graf | H01J 37/20 250/492.21 |
| 2009/0302214 A1* | 12/2009 | Igo | H01J 37/1471 250/282 |
| 2010/0112788 A1 | 5/2010 | Ramappa | |
| 2010/0171048 A1* | 7/2010 | Nakamoto | H01J 37/05 250/492.21 |
| 2010/0197047 A1* | 8/2010 | Ko | H01L 21/76243 438/5 |
| 2011/0036990 A1* | 2/2011 | Stone | H01J 37/20 250/423 R |
| 2011/0171817 A1* | 7/2011 | Lee | H01J 37/08 438/513 |
| 2011/0260047 A1* | 10/2011 | Lee | H01L 21/26513 250/282 |

* cited by examiner

IMPLANT-INDUCED DAMAGE CONTROL IN ION IMPLANTATION

REFERENCE TO RELATED APPLICATION

This application claims priority to and the benefit of U.S. Provisional Application Ser. No. 61/695,836 which was filed Aug. 31, 2012, entitled "IMPLANT-INDUCED DAMAGE CONTROL IN ION IMPLANTATION", the entirety of which is hereby incorporated by reference as if fully set forth herein.

TECHNICAL FIELD

The present invention relates generally to ion implantation systems, and more specifically to a control of scan frequency and duty cycle in a scanned spot ion beam to control a rate of implant-induced damage accumulation in a workpiece.

BACKGROUND

Rapid and continuous expansion of electronic devices, with an emphasis on wireless and handheld technology, has placed new challenges on semiconductor manufacturing. Device technologies have evolved, demanding smaller transistors with greater performance. Improving device performance and lowering deleterious leakage currents in devices has become an important area of focus. One semiconductor manufacturing process that plays a contributory role in deleterious leakage currents in formed devices is ion implantation processing.

Ion implantation introduces damage in a lattice structure of a semiconductor workpiece (e.g., silicon) based on many factors, including dosage of ions being implanted, a mass of the implanted ion, a dosage rate (ions/$cm^2$/second), and workpiece temperature. Ion implantation processing typically produces point defects in the workpiece, wherein interstitials, vacancies, and other point defects occur during implantation. Conventionally, point defects subsequently form extended defects upon annealing of workpiece, wherein the point defect can extend into active areas of the workpiece. The extended defects, for example, can cause junction leakage in the formed device, such as leakage from a source/drain region to a well region of the device. Ultimately, these leakages have the potential to increase the power required to operate the device and/or increase standby power consumption of the device.

One factor in determining the average dose rate of the ion implantation process is the architecture of the ion implanter. For example, in a batch or multi-workpiece system, a plurality of workpieces are concurrently implanted with ions, often by spinning a platen on which the plurality of workpieces rest through a stationary ion beam or ribbon beam. In a single-workpiece system, a single workpiece is individually scanned in one dimension or two dimensions with respect to an ion beam which may also be scanned. The architecture of the ion implantation system can have a profound effect on the average dose rate for any particular location on the workpiece, and thus, the degree of damage caused in a lattice structure of the workpiece. For example, a single-workpiece system has a higher effective dose rate than a batch system, despite both systems having common ion beam densities, thus making single-workpiece ion implantation systems desirable for devices requiring high-dosage implants where it is desired to maximize the damage to the lattice structure of the workpiece.

For example, among single-workpiece architectures, different scanning methodologies have been employed in commercial ion implantation systems, with a variation in one-dimension mechanical scanning combined with electrostatic and/or magnetic scanning for horizontal spread of the ion beam and increased uniformity. These systems have focused on high throughput and minimum cross-wafer dose variation as key attributes affecting design implementations. However, damage to the lattice structure of the workpiece caused by either high-dosage and/or high energy implants in single-workpiece architectures has been problematic. Therefore, a need exists in the art for an apparatus, system, and method for controlling localized damage accumulation on a workpiece while optimizing workpiece throughput in a single-workpiece ion implantation architecture.

SUMMARY

The present invention overcomes the limitations of the prior art by providing a system, apparatus, and method for establishing a predetermined localized disorder of a crystalline structure of a workpiece subjected to a spot ion beam in a single-workpiece ion implantation architecture via a control of a localized temperature of the workpiece. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with the present disclosure, an ion implantation system for implanting ions is provided. The ion implantation system, for example, comprises an ion implantation apparatus configured to provide a spot ion beam having a beam density associated therewith to a workpiece, wherein the workpiece has an initial crystalline structure associated therewith. A scanning system is further provided and configured to iteratively scan one or more of the spot ion beam and workpiece with respect to one another along one or more axes. The scanning system, for example, comprises one or more of a workpiece scanning system configured to scan the workpiece with respect to the spot ion beam and a beam scanning system configured to scan the spot ion beam along a fast scan axis. In one example, the workpiece scanning system is configured to scan the workpiece along a slow scan axis, wherein the fast scan axis and slow scan axis are non-parallel. In another example, the workpiece scanning system is configured to scan the workpiece with respect to the spot ion beam along both the fast scan axis and slow scan axis, wherein the spot ion beam is generally stationary.

According to another aspect of the disclosure, a controller is provided and configured to establish a predetermined localized temperature of the workpiece as a predetermined location on the workpiece is exposed to the spot ion beam. Accordingly, a predetermined localized disorder of the crystalline structure of the workpiece is established at the predetermined location. The predetermined localized disorder of the crystalline structure of the workpiece, for example, is associated with a desired post-anneal crystalline structure of the workpiece associated with an annealing of the workpiece at a predetermined anneal temperature.

The controller, in one example, is configured to control one or more of the beam density of the spot ion beam and a duty cycle or scanning frequency and waveform associated with the scanning system in order to establish the localized temperature of the workpiece at the predetermined location on the workpiece. The duty cycle is associated with a ratio of time in which the workpiece is exposed to the spot ion beam to a total time associated with scanning one or more of the spot ion beam and workpiece with respect to one another. The controller, for example, is configured to control a speed of the scanning of the one or more of the spot ion beam and workpiece with respect to one another and a time of exposure of the workpiece to the spot ion beam during the scanning. The controller, in another example, is further configured to selectively prevent the workpiece from being exposed to the spot ion beam between iterative scans via a control of the scanning system, thereby controlling the duty cycle. The controller, in yet another example, is further configured to permit the workpiece to cool from the predetermined localized temperature at the predetermined location via the control of the scanning system. For example, the controller is configured to control the localized temperature at the predetermined location on the workpiece by permitting the localized temperature to decrease between successive scans via the control of the duty cycle. In yet another example, a temperature sensor is further configured to provide feedback to the controller associated with the predetermined localized temperature.

A method for controlling a localized disorder of a crystalline structure of a workpiece during ion implantation is further provided. The method comprises providing a spot ion beam having a beam density associated therewith to a workpiece, and repeatedly scanning one or more of the spot ion beam and workpiece with respect to one another in one or more axes. The localized temperature of the workpiece as the workpiece is exposed to the spot ion beam is controlled by controlling one or more of the beam density of the spot ion beam and a duty cycle associated with the scanning of the one or more of the spot ion beam and workpiece with respect to one another. Accordingly, a predetermined localized disorder of the crystalline structure of the workpiece is established.

Controlling the duty cycle, for example, comprises controlling a ratio of time in which the workpiece is exposed to the spot ion beam to a total time associated with scanning one or more of the spot ion beam and workpiece with respect to one another. Controlling the duty cycle, for example, further comprises controlling a speed of the scanning of the one or more of the spot ion beam and workpiece with respect to one another and a total time of exposure of the workpiece to the spot ion beam. Controlling the duty cycle can further comprise selectively preventing the workpiece from being exposed to the spot ion beam between successive scans.

The above summary is merely intended to give a brief overview of some features of some embodiments of the present invention, and other embodiments may comprise additional and/or different features than the ones mentioned above. In particular, this summary is not to be construed to be limiting the scope of the present application. Thus, to the accomplishment of the foregoing and related ends, the invention comprises the features hereinafter described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
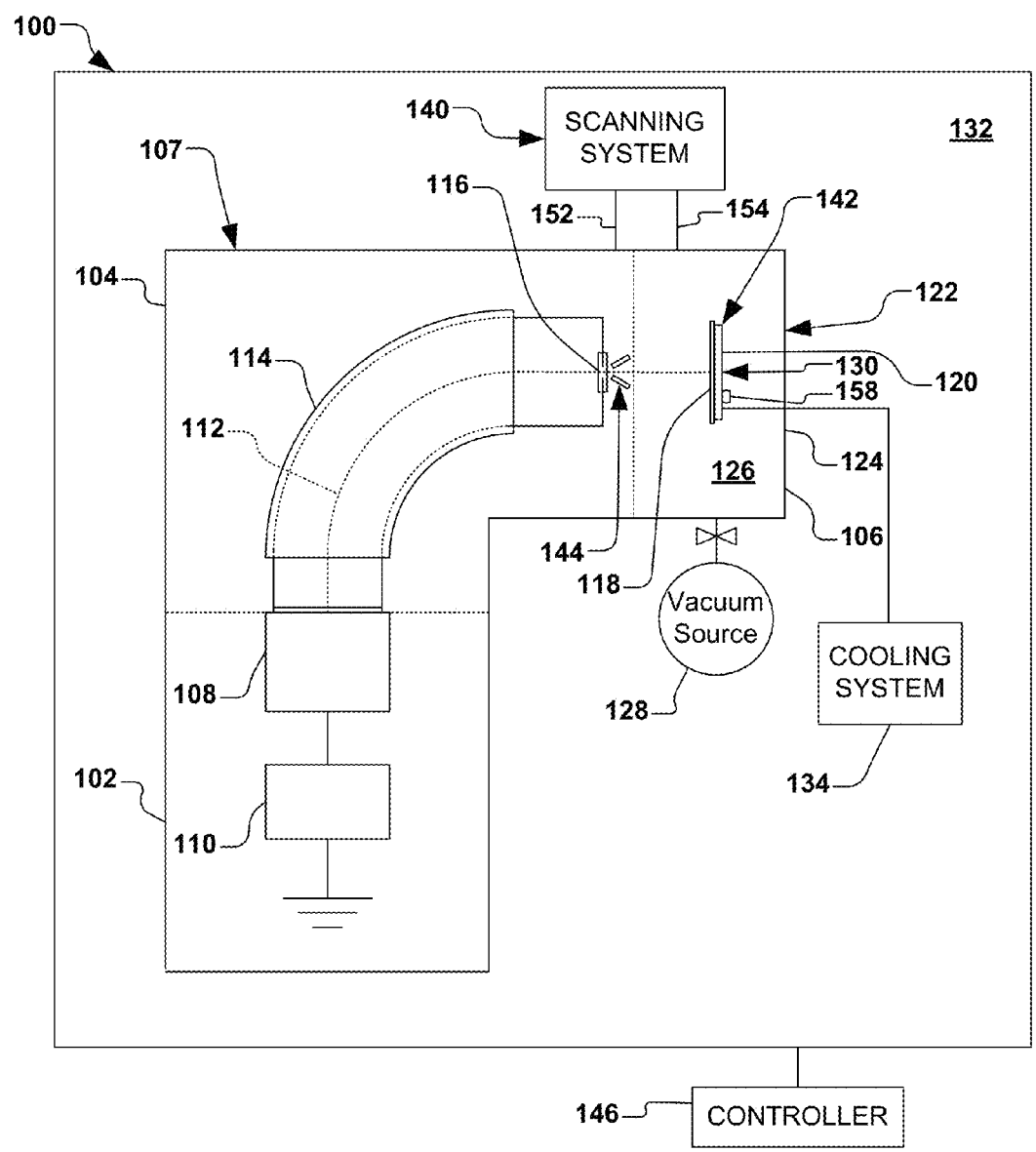
FIG. 1 is a block diagram of an exemplary ion implantation system in accordance with several aspects of the present disclosure.

The present disclosure is directed generally toward an apparatus, system, and method for controlling localized damage accumulation on a semiconductor workpiece while optimizing workpiece throughput in a single-workpiece ion implantation architecture. Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

Process control in ion implantation systems is often primarily focused on ion beam variables such as ion species, energy, dose, and beam current. Workpiece-level process control has been limited to crystallographic orientation of the semiconductor workpiece to control channeling and providing adequate charge control in the final device. A second order consideration is workpiece temperature control. The workpiece absorbs power equal to the product of ion beam current and beam energy, which is a value that can be a few thousand watts. Unchecked, power absorbed by the workpiece results in an increased temperature of the workpiece. Conventionally, workpiece temperature has been loosely controlled using process cooling water and chillers associated with a cooled chuck on which the workpiece is retained.

Workpiece temperatures have been controlled by such cooled chucks to protect a photoresist mask formed on the workpiece that is often used to delineate areas on the workpiece that are to be implanted with ions. The photoresist material often flows and melts at temperatures exceeding just over 120° C. If the workpiece temperatures are maintained at <100° C., little consideration has been traditionally given to the absolute or actual temperature of the workpiece. As a result, the topic of workpiece temperature control has been traditionally limited to ways of preventing burning or melting of photoresist, without consideration to more complex crystallographic effects.

The present disclosure, however, appreciates that controlling the crystallographic effects caused by heightened temperatures in the workpiece is advantageous, and defines such control as "Damage Engineering". Damage Engineering disclosed in the present disclosure purposefully characterizes and controls the nature and location of ion implantation "damage", or the localized disorder of the crystalline structure of the workpiece, using dose rate and workpiece temperature control.

Dominant factors establishing latent damage from ion implantation are ion mass, energy, ion dose, instantaneous dose rate (ion beam current per unit area), and workpiece temperature. Ion mass, energy, and ion dose are determined by the requirements of the particular device being formed, and are often fixed for a process recipe. Further, for some applications, it is desirable for the dose rate to be maximized for given conditions, as the highest ion beam current (e.g., dose rate) is the condition of maximum throughput, or the "ideal" manufacturing condition. Thus, modulating the dose rate can have effects on production throughput.

The present disclosure appreciates that temperature control (e.g., also called "instantaneous temperature control" or control of a localized temperature at a location on the workpiece as the workpiece is impinged by the ion beam) is one more means to provide process control in ion implantations, thus microscopically controlling the localized disorder of the crystalline structure of the workpiece.

Thus, in accordance with one aspect of the present disclosure, FIG. 1 illustrates an exemplary ion implantation system 100, wherein the ion implantation system, for example, comprises a terminal 102, a beamline assembly 104, and an end station 106. Generally speaking, the terminal 102, beamline assembly 104, and end station 106 define an ion implantation apparatus 107, wherein an ion source 108 in the terminal 102 is coupled to a power supply 110 to ionize a dopant gas into a plurality of ions and to form an ion beam 112. The ion beam 112 in the present example is directed through a beam-steering apparatus 114, and out an aperture 116 towards the end station 106. In the end station 106, the ion beam 112 bombards a workpiece 118 (e.g., a semiconductor such as a silicon wafer, a display panel, etc.), which is selectively clamped or mounted to a chuck 120 (e.g., an electrostatic chuck or ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112, for example, has one of a circular and generally elliptical cross-section when viewed along a direction of travel of the ion beam (e.g., the z-direction). As such, the ion beam 112 of the present disclosure comprises a pencil or spot beam 121 or a scanned pencil or spot beam (e.g., the spot beam scanned in one or more of the x-direction and y-direction), in which ions are directed toward the end station 106, and all such forms are contemplated as falling within the scope of the disclosure, and are generically referred to as an "ion beam" or "spot ion beam".

According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber.

During an implantation utilizing the ion implantation system 100, energy can build up on the workpiece 118 in the form of heat, as the charged ions collide with the workpiece. Absent countermeasures, such heat can potentially warp or crack the workpiece 118, or damage films or materials on the workpiece surface, which may render the workpiece worthless (or significantly less valuable) in some implementations. The heat can further cause the dose of ions delivered to the workpiece 118 to differ from the dosage desired, which can alter functionality from what is desired. Thus, in accordance with another example, the chuck 120 comprises a sub-ambient temperature chuck 130, wherein the sub-ambient temperature chuck is configured to both support and cool or otherwise maintain a temperature on the workpiece 118 within the process chamber 122 during the exposure of the workpiece to the ion beam 112. It should be noted that while the chuck 120 is referred to in the present example as being the sub-ambient temperature chuck 130, the chuck 120 can likewise comprise a super-ambient temperature chuck (not shown), wherein the super-ambient temperature chuck is configured to support and heat the workpiece 118 within the process chamber 122.

The sub-ambient temperature chuck 130, for example, is an electrostatic chuck configured to cool or chill the workpiece 118 to a processing temperature that is considerably lower than an ambient or atmospheric temperature of the surroundings or external environment 132 (e.g., also called an "atmospheric environment"). Likewise, in a case where the chuck 120 comprises the above-described super-ambient temperature chuck, the super-ambient temperature chuck may comprise an electrostatic chuck configured to heat the workpiece 118 to a processing temperature that is considerably higher than the ambient or atmospheric temperature of the surroundings or external environment 132. A cooling system 134 may be further provided, wherein, in another example, the cooling system is configured to cool or chill the sub-ambient temperature chuck 130, and thus, the workpiece 118 residing thereon, to the processing temperature. In another example, and in a similar manner, a heating system (not shown) may be further provided in the case of a super-ambient temperature chuck, wherein the heating system is configured to heat the super-ambient temperature chuck and workpiece 118 residing thereon to the processing temperature.

In accordance with the present disclosure, the ion implantation apparatus 107 is configured to provide a spot ion beam 121 having a beam density associated therewith to the workpiece 118, wherein the workpiece has a crystalline structure associated therewith, as will be discussed in greater detail infra. In accordance with another example, a scanning system 140 is provided, wherein the scanning system 140 is configured to iteratively scan one or more of the spot ion beam 121 and workpiece 118 with respect to one another along one or more axes (e.g., the x-direction and/or y-direction). For example, the scanning system 140 comprises a workpiece scanning system 142 configured to scan the workpiece 118 (e.g., along a slow scan axis associated with the x-axis) with respect to the spot ion beam 121. The scanning system, for example, optionally further comprises a beam scanning system 144 configured to scan the spot ion beam 121 (e.g., along a fast scan axis associated with the y-axis). The beam scanning system 144, for example, is configured to electrostatically or magnetically scan the spot ion beam 121 along the fast scan axis. In yet another example, the workpiece scanning system 142 is configured to scan the workpiece 118 with respect to the spot ion beam 121 along the fast scan axis and slow scan axis, thereby defining a 2-dimensional mechanical scan architecture.

Figure 2:
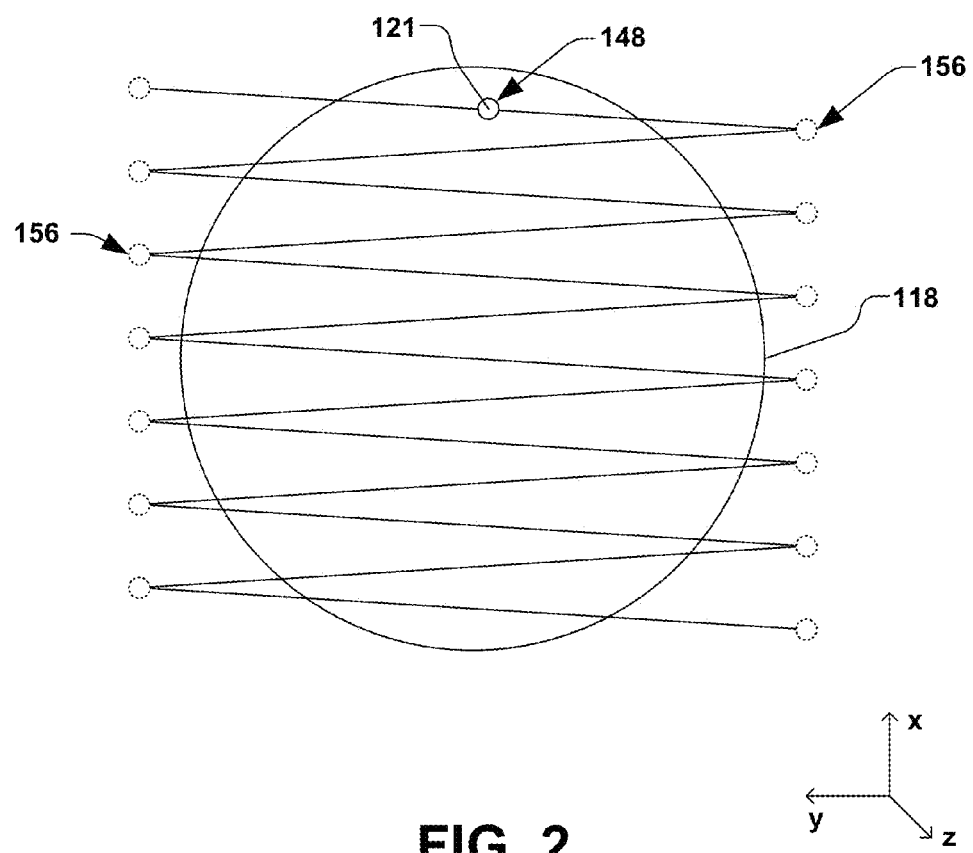
FIG. 2 is a plan view of iterative scans of a workpiece with respect to a spot ion beam in accordance with one example of the disclosure.

In accordance with one aspect of the disclosure, a controller 146 is provided and configured to establish a predetermined localized temperature of the workpiece 118 as a predetermined location 148 illustrated in FIG. 2 on the workpiece is exposed to the spot ion beam 121, wherein a predetermined localized disorder of the crystalline structure of the workpiece 118 is established at the predetermined location. In one example, the predetermined localized disorder of the crystalline structure of the workpiece 118 is associated with a desired post-anneal crystalline structure of the workpiece associated with a subsequent annealing of the workpiece at a predetermined anneal temperature.

The controller 146, for example, is configured to control one or more of the beam density of the spot ion beam 121 and a duty cycle associated with the scanning system 140 to establish the localized temperature of the workpiece 118 at the predetermined location 148 on the workpiece during the scanning. It should be noted that while the predetermined location 148 is illustrated in FIG. 2 as one location on the workpiece 118, the predetermined location varies, based on where the spot ion beam 121 impinges the workpiece.

The duty cycle, for example, is associated with a ratio of time in which the workpiece 118 is exposed to the spot ion beam 121 to a total time associated with scanning one or more of the spot ion beam and workpiece with respect to one another. The controller 146 of FIG. 1, for example, is further configured to control a speed of the scanning of the one or more of the spot ion beam 121 and workpiece 118 with respect to one another via a control of the scanning system 140, as well as a time of exposure of the workpiece to the spot ion beam during the scanning. Furthermore, the controller 146 is configured to selectively prevent the workpiece 118 from being exposed to the spot ion beam 121 between iterative scans 150 via a control of the scanning system 140, thereby controlling the duty cycle.

As such, the controller 146 of FIG. 1 is configured to provide a variable frequency modulated scan signal 152 and/or a variable duty cycle scan signal 154 to the scanning system 140 for varying the time that the spot ion beam 121 impinges the workpiece. The variable frequency modulated scan signal 152 and/or a variable duty cycle scan signal 154, for example, are based on one or more of a velocity of the scan of the spot ion beam 121 with respect to the workpiece 118 and/or an amount of time that the spot ion beam is "parked" off of the workpiece (e.g., at position 156 of FIG. 2).

Thus, it will be understood that the scan speed and/or off time at position 156 generally allows the workpiece 118 to "recover" from the increase in temperature caused by exposure of the workpiece to the spot ion beam 121, thereby providing enhanced damage engineering. For example, the controller 146 of FIG. 1 is configured to permit the workpiece 118 to cool from the predetermined localized temperature at the predetermined location 148 via the control of the scanning system 140. The controller 146, in another example, is configured to control the localized temperature at the predetermined location 148 on the workpiece 118 by permitting the localized temperature to decrease between successive scans via the control of the duty cycle.

The controller 146, in one example, is configured could operate under instruction provided by empirical data that would indicate an appropriate scan speed and/or duty cycle of the spot ion beam 121 as a function of known data relating to the spot ion beam, such as dose, energy, beam flux, or the like. Alternatively, a temperature sensor 158 (e.g., thermocouple, infrared sensor, etc.) is provided and configured to provide feedback to the controller 146 associated with the predetermined localized temperature. As such, a real time management of the predetermined localized temperature can be attained via in-situ temperature measurement of the workpiece 118.

Figure 3A:
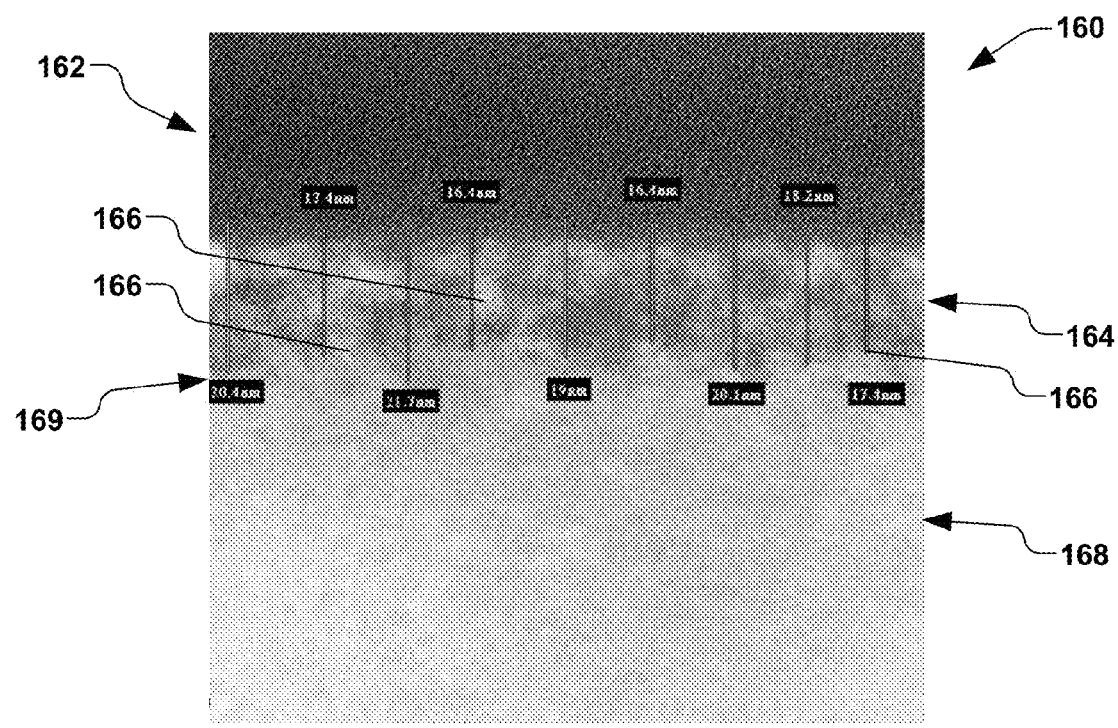
FIG. 3A is a TEM image of silicon crystalline surface damage on a workpiece after ion implantation with low beam density and low duty cycle.

In order to better understand the disclosure, FIG. 3A illustrates a transmission electron microscope (TEM) image 160 of silicon crystalline damage on a workpiece 162 after an ion implantation utilizing a low beam density and low duty cycle. As illustrated, when beam density and duty cycle (e.g., the time of the ion beam presence at any given location on the workpiece) is relatively low, the implanted layer or region 164 is not fully amorphized, wherein a mixture of the amorphous region exists with some inclusions or damaged areas 166 of remaining crystalline substrate 168. As such, a boundary region 169 between the damaged areas 166 and crystalline substrate 168 on the workpiece 162 is thus rough and not well defined.

Figure 3B:
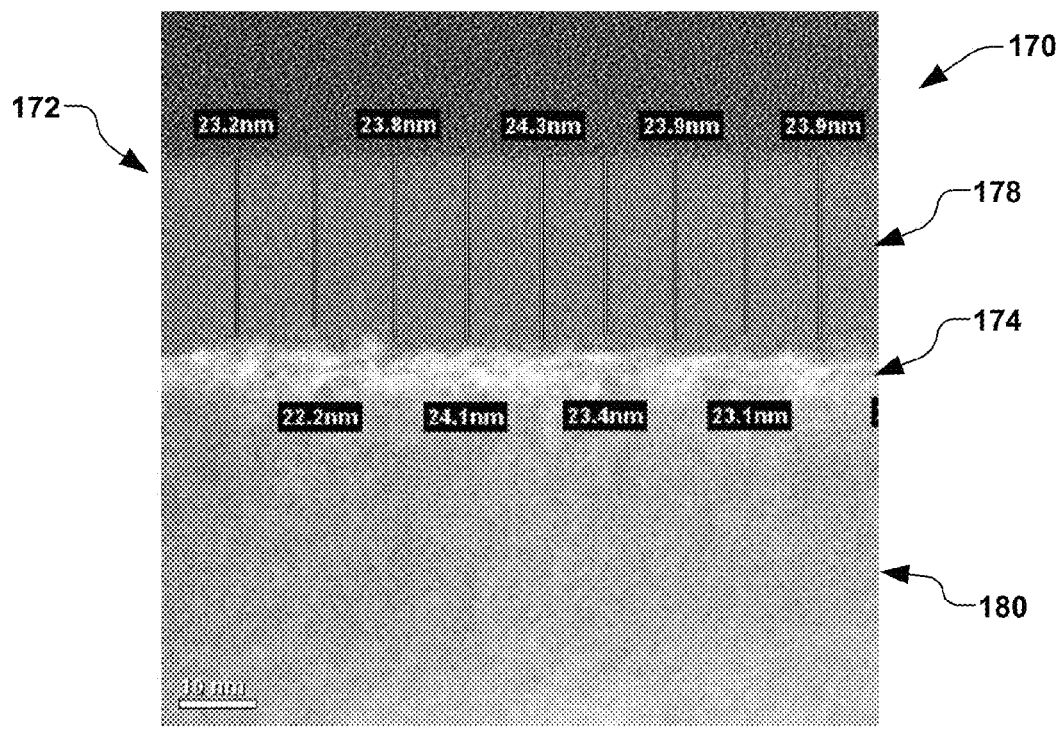
FIG. 3B is a TEM image of silicon crystalline surface damage on a workpiece after ion implantation with high beam density and high duty cycle.

FIG. 3B, on the other hand, illustrates another TEM image 170 of silicon crystalline damage on another workpiece 172 after an ion implantation utilizing a high beam density and high duty cycle. In contrast with the TEM image 160 of FIG. 3A, the TEM image 170 of FIG. 3B illustrates a damaged layer 174 that is substantially or fully amorphized. Accordingly, a significantly smooth and distinctive boundary 176 exists between an amorphous region 178 and crystal region 180 of the workpiece 172 after ion implantation utilizing a high beam density and high duty cycle in accordance with the present disclosure.

Figure 4:
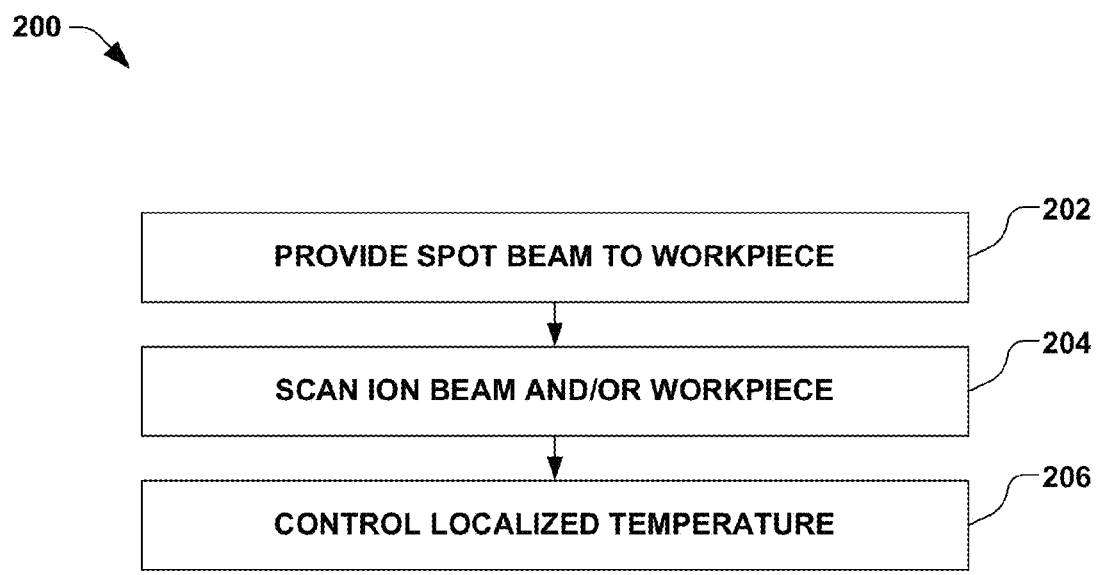
FIG. 4 illustrates a methodology for controlling localized damage accumulation on a semiconductor workpiece, in accordance with to still another aspect.

In accordance with another exemplary aspect of the invention, FIG. 4 illustrates an exemplary method 200 for processing and controlling a localized disorder of a crystalline structure of a workpiece during ion implantation. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

The method 200 of FIG. 4 begins at act 202, wherein a spot ion beam is provided to a workpiece, and wherein the spot ion beam has a beam density associated therewith. The spot ion beam, for example, comprises the spot ion beam 121 of FIGS. 1 and 3. In act 204 of FIG. 4, one or more of the spot ion beam and workpiece are iteratively scanned with respect to one another in one or more axes. For example, the workpiece 118 of FIG. 1 is mechanically scanned along a slow scan axis with respect to the spot ion beam 121, while the spot ion beam is electrostatically and/or magnetically scanned along a fast scan axis, as described above. Alternatively, the workpiece 118 is mechanically scanned along the fast scan axis and slow scan axis, wherein the fast scan axis and slow scan axis are non-parallel.

In act 206 of FIG. 4, a localized temperature of the workpiece is controlled as the workpiece is exposed to the spot ion beam, wherein a predetermined localized disorder of the crystalline structure of the workpiece is established. The control of the localized temperature of the workpiece in act 206, for example, comprises controlling one or more of the beam density of the spot ion beam and a duty cycle associated with the scanning of the one or more of the spot ion beam and workpiece with respect to one another. Controlling the duty cycle, for example, comprises controlling a ratio of time in which the workpiece is exposed to the spot ion beam to a total time associated with scanning one or more of the spot ion beam and workpiece with respect to one another. Controlling the duty cycle may further comprise controlling a speed of the scanning of the one or more of the spot ion beam and workpiece with respect to one another and a total time of exposure of the workpiece to the spot ion beam. In another example, controlling the duty cycle alternatively, or in addition, comprises selectively preventing the workpiece from being exposed to the spot ion beam between successive scans.

In one example, controlling the duty cycle in act 206 controls the localized temperature of the workpiece by allowing the localized temperature to decrease between successive scans. The localized temperature of the workpiece can be further measured, as discussed above, wherein controlling the one or more of the beam density of the spot ion beam and duty cycle in act 206 is further based, at least in part, on the measured localized temperature.

Figure 5:
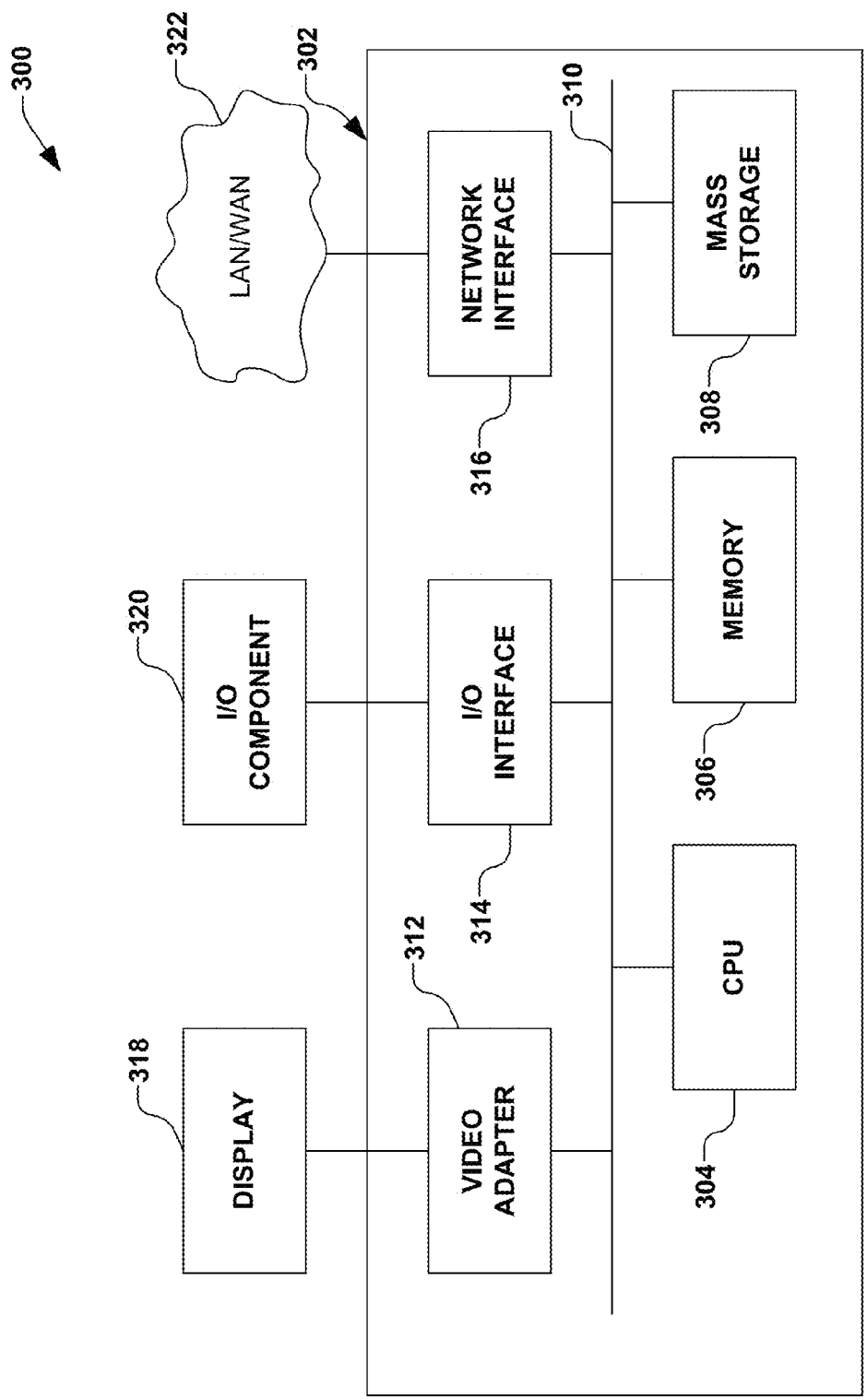
FIG. 5 illustrates a schematic representation of an exemplary processor-based system for controlling localized damage accumulation on a semiconductor workpiece.

In accordance with another aspect, the aforementioned methodology may be implemented using computer program code in one or more general purpose computer or processor based system. As illustrated in FIG. 5, a block diagram is provided of a processor based system 300 is provided in accordance with another embodiment. For example, the controller 146 of FIG. 1 may comprise the processor based system 300 of FIG. 5. The processor based system 300, for example, is a general purpose computer platform and may be used to implement processes discussed herein. The processor based system 300 may comprise a processing unit 302, such as a desktop computer, a workstation, a laptop computer, or a dedicated unit customized for a particular application. The processor based system 300 may be equipped with a display 318 and one or more input/output devices 320, such as a mouse, a keyboard, or printer. The processing unit 302 may include a central processing unit (CPU) 304, memory 306, a mass storage device 308, a video adapter 312, and an I/O interface 314 connected to a bus 310.

The bus 310 may be one or more of any type of several bus architectures including a memory bus or memory controller, a peripheral bus, or video bus. The CPU 304 may comprise any type of electronic data processor, and the memory 306 may comprise any type of system memory, such as static random access memory (SRAM), dynamic random access memory (DRAM), or read-only memory (ROM).

The mass storage device 308 may comprise any type of storage device configured to store data, programs, and other information and to make the data, programs, and other information accessible via the bus 310. The mass storage device 308 may comprise, for example, one or more of a hard disk drive, a magnetic disk drive, or an optical disk drive.

The video adapter 312 and the I/O interface 314 provide interfaces to couple external input and output devices to the processing unit 302. Examples of input and output devices include the display 318 coupled to the video adapter 312 and the I/O device 320, such as a mouse, keyboard, printer, and the like, coupled to the I/O interface 314. Other devices may be coupled to the processing unit 302, and additional or fewer interface cards may be utilized. For example, a serial interface card (not shown) may be used to provide a serial interface for a printer. The processing unit 302 also may include a network interface 316 that may be a wired link to a local area network (LAN) or a wide area network (WAN) 322 and/or a wireless link.

It should be noted that the processor based system 300 may include other components or exclude some components described herein. For example, the processor based system 300 may include power supplies, cables, a motherboard, removable storage media, cases, and the like. These other components, although not shown, are considered part of the processor based system 300.

Embodiments of the present disclosure may be implemented on the processor based system 300, such as by program code executed by the CPU 304. Various methods according to the above-described examples and embodiments may be implemented by program code. Accordingly, explicit discussion herein is omitted.

Further, it should be noted that the modules and devices in FIG. 1 may all be implemented on one or more processor based systems 300 of FIG. 5. Communication between the different modules and devices may vary depending upon how the modules are implemented. If the modules are implemented on one processor based system 300, data may be saved in memory 306 or mass storage 308 between the execution of program code for different steps by the CPU 304. The data may then be provided by the CPU 304 accessing the memory 306 or mass storage 308 via bus 310 during the execution of a respective step. If modules are implemented on different processor based systems 300 or if data is to be provided from another storage system, such as a separate database, data can be provided between the systems 300 through I/O interface 314 or network interface 316. Similarly, data provided by the devices or stages may be input into one or more processor based system 300 by the I/O interface 314 or network interface 316. A person having ordinary skill in the art will readily understand other variations and modifications in implementing systems and methods that are contemplated within the scope of varying embodiments.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An ion implantation system, comprising:
   an ion implantation apparatus configured to provide a spot ion beam having a beam density associated therewith to a workpiece, wherein the workpiece has a crystalline structure associated therewith;
   a scanning system configured to iteratively scan one or more of the spot ion beam and the workpiece with respect to one another along one or more axes;
   a controller configured to establish a predetermined localized temperature of the workpiece as a predetermined location on the workpiece is exposed to the spot ion beam, wherein a predetermined localized disorder of the crystalline structure of the workpiece is established at the predetermined location, and wherein the controller is configured to control one or more of the beam density of the spot ion beam and a duty cycle associated with the scanning system to establish the localized temperature of the workpiece at the predetermined location on the workpiece.

2. The ion implantation system of claim 1, wherein the duty cycle is associated with a ratio of time in which the workpiece is exposed to the spot ion beam to a total time associated with scanning one or more of the spot ion beam and workpiece with respect to one another.

3. The ion implantation system of claim 1, wherein the controller is configured to control a speed of the scanning of the one or more of the spot ion beam and workpiece with respect to one another, a time of exposure of the workpiece to the spot ion beam during the scanning, and the duty cycle and frequency of the scanning relative to the workpiece.

4. The ion implantation system of claim 3, wherein the controller is further configured to selectively prevent the workpiece from being exposed to the spot ion beam between iterative scans via a control of the scanning system, thereby controlling the duty cycle.

5. The ion implantation system of claim 4, wherein the controller is configured to permit the workpiece to cool from the predetermined localized temperature at the predetermined location via the control of the scanning system.

6. The ion implantation system of claim 1, wherein the scanning system comprises a workpiece scanning system configured to scan the workpiece with respect to the spot ion beam.

7. The ion implantation system of claim 6, wherein the scanning system further comprises a beam scanning system configured to scan the spot ion beam along a fast scan axis, and wherein the workpiece scanning system is configured to scan the workpiece along a slow scan axis, wherein the fast scan axis and slow scan axis are non-parallel.

8. The ion implantation system of claim 6, wherein the workpiece scanning system is configured to scan the workpiece with respect to the spot ion beam along a fast scan axis and a slow scan axis, wherein the fast scan axis and slow scan axis are non-parallel.

9. The ion implantation system of claim 1, wherein the controller is configured to control the localized temperature at the predetermined location on the workpiece by permitting the localized temperature to decrease between successive scans via the control of the duty cycle.

10. The ion implantation system of claim 1, wherein the predetermined localized disorder of the crystalline structure of the workpiece is associated with a desired post-anneal crystalline structure of the workpiece associated with an annealing of the workpiece at a predetermined anneal temperature.

11. The ion implantation system of claim 1, further comprising a temperature sensor configured to provide feedback to the controller associated with the predetermined localized temperature.

* * * * *